United States Patent
Shih et al.

(10) Patent No.: US 8,581,239 B2
(45) Date of Patent: Nov. 12, 2013

(54) PACKAGE STRUCTURE AND SEMICONDUCTOR STRUCTURE THEREOF

(75) Inventors: Cheng-Hung Shih, Changhua County (TW); Shu-Chen Lin, Pingtung County (TW); Yung-Wei Hsieh, Hsinchu (TW); Jun-Yu Yeh, Hsinchu County (TW)

(73) Assignee: Chipbond Technology Corporation, Hsinchu (TW)

( * ) Notice: Subject to any disclaimer, the term of this patent is extended or adjusted under 35 U.S.C. 154(b) by 94 days.

(21) Appl. No.: 13/353,380

(22) Filed: Jan. 19, 2012

(65) Prior Publication Data

US 2013/0187265 A1    Jul. 25, 2013

(51) Int. Cl.
*H01L 35/24*    (2006.01)
(52) U.S. Cl.
USPC ............. 257/40; 257/710; 257/737; 257/759; 257/E23.021
(58) Field of Classification Search
USPC ........... 257/40, 704, 710, 734, 739, 741, 751, 257/759, 762, 767, 787, E23.021, 737
See application file for complete search history.

(56) References Cited

U.S. PATENT DOCUMENTS

2006/0094223 A1*    5/2006    Tsai .............................. 438/612

\* cited by examiner

*Primary Examiner* — Jack Chen
(74) *Attorney, Agent, or Firm* — Jackson IPG PLLC

(57) ABSTRACT

A semiconductor structure comprises a carrier, a plurality of under bump metallurgy layers, a plurality of copper containing bumps and an organic barrier layer, wherein the carrier comprises a protective layer and a plurality of conductive pads, mentioned protective layer comprises a plurality of openings, the conductive pads exposed by the openings, mentioned under bump metallurgy layers being formed on the conductive pads, mentioned copper containing bumps being formed on the under bump metallurgy layers, each of the copper containing bumps comprises a top surface and a ring surface in connection with the top surface, mentioned organic barrier layer having a first coverage portion, and mentioned first coverage portion covers the top surface and the ring surface of each of the copper containing bumps.

9 Claims, 8 Drawing Sheets

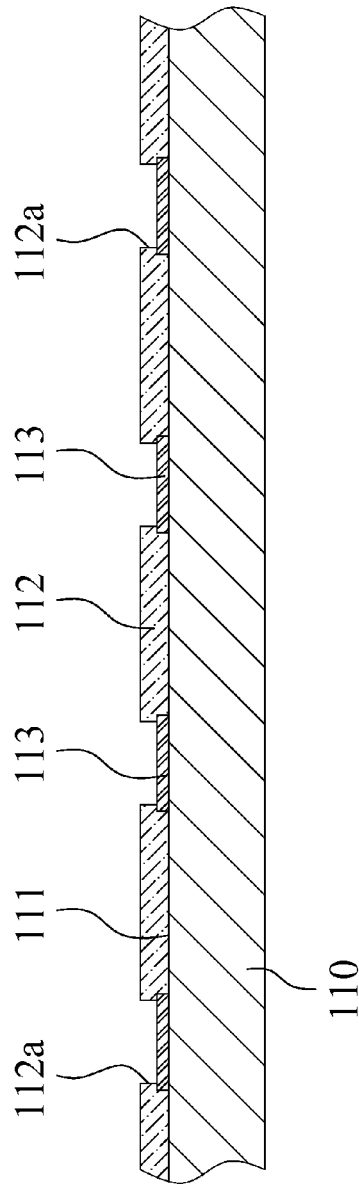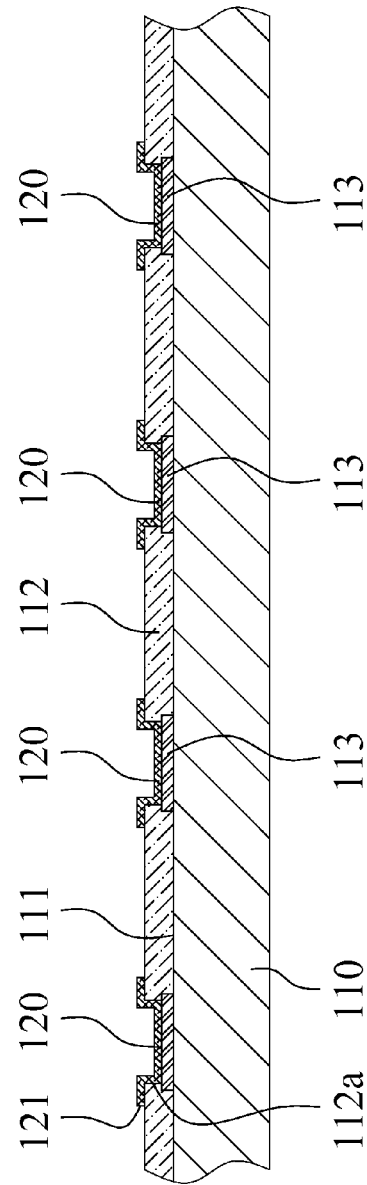

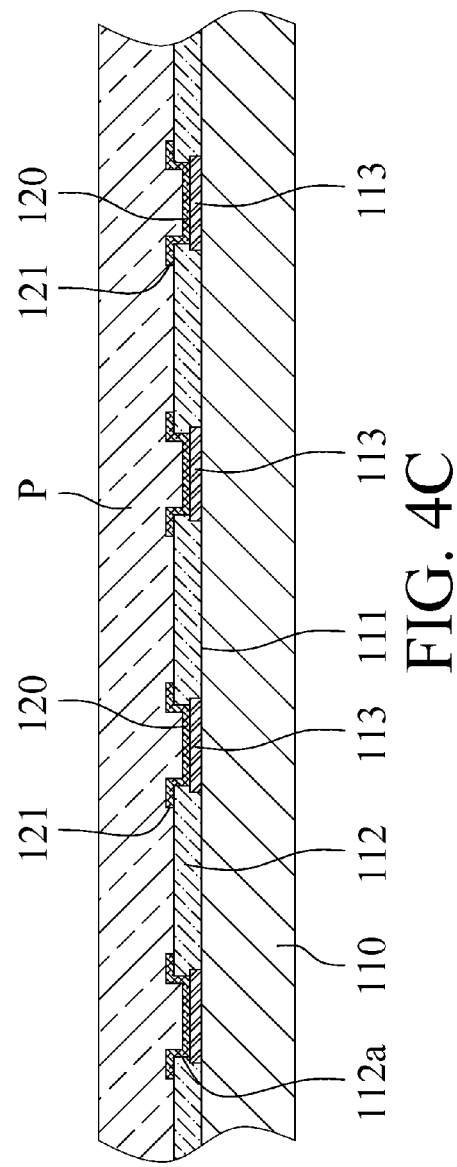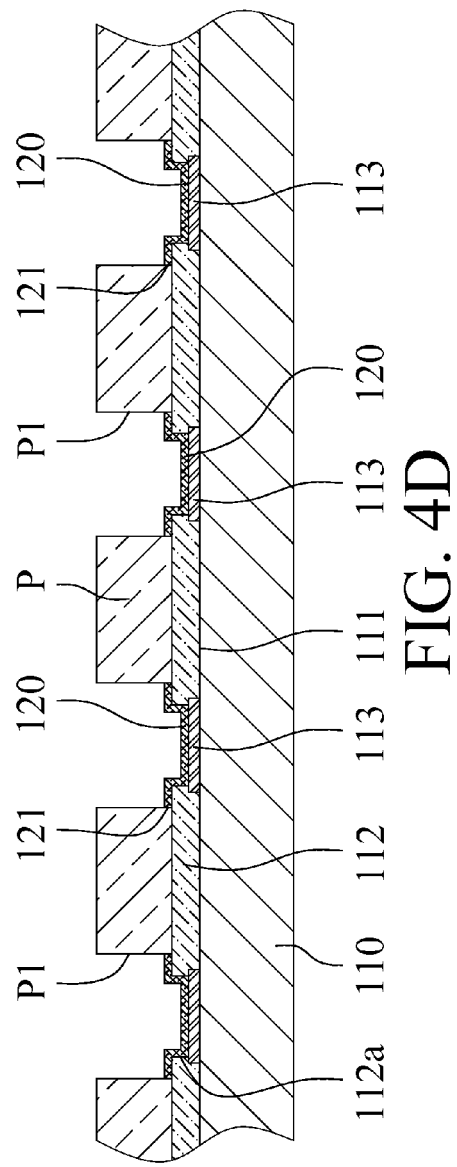

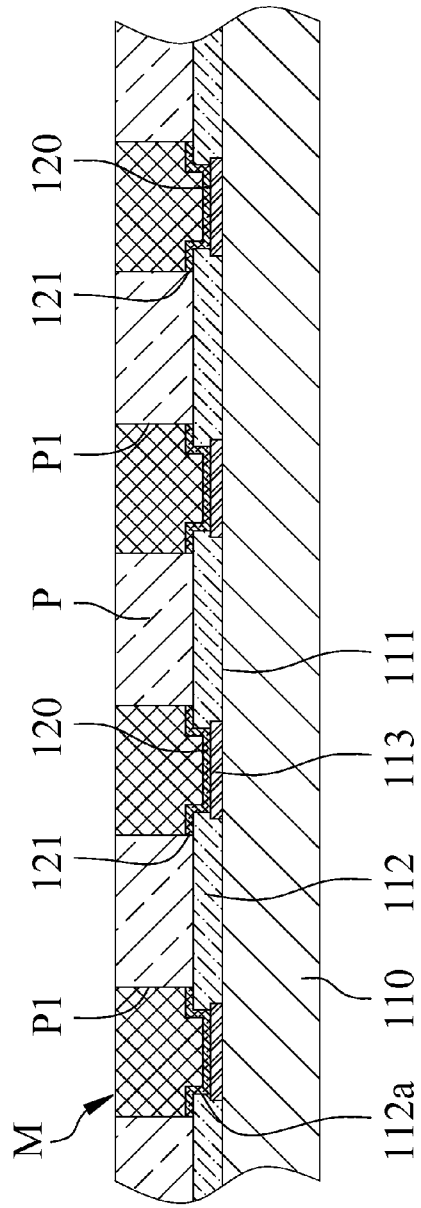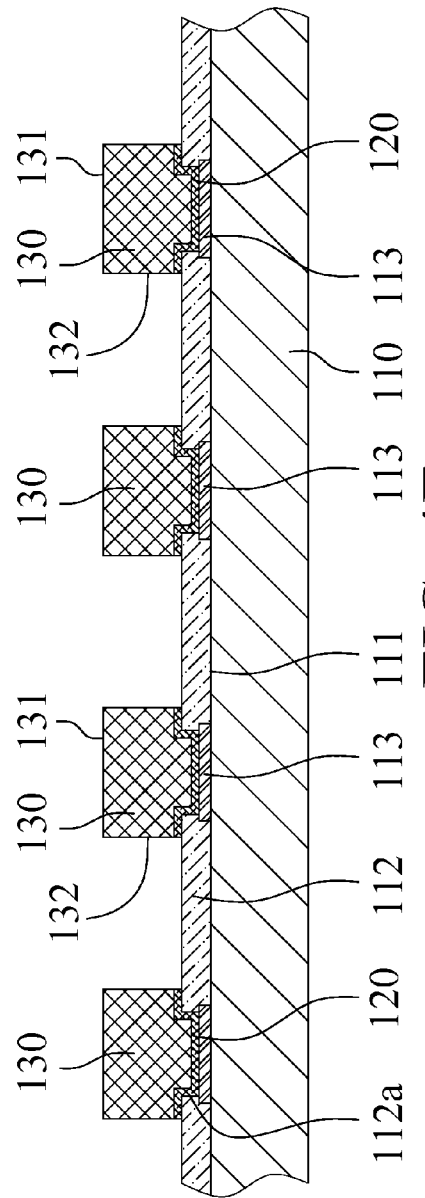
FIG. 4E
FIG. 4F

PACKAGE STRUCTURE AND SEMICONDUCTOR STRUCTURE THEREOF

FIELD OF THE INVENTION

The present invention is generally related to a package structure and semiconductor structure thereof, which particularly relates to the semiconductor structure with organic barrier layer.

BACKGROUND OF THE INVENTION

The profile in modern electronic products gradually leads a direction of light, thin, short, and small. Therefore, some electronic connection devices destine to develop a micro-scaled technique such as "adjacent micro-spaced bumps" or "adjacent micro-spaced pins". However, when mentioned bumps or pins include with copper components, a short phenomenon is easily occurred via dissociation of copper ions therefore causing failure products.

SUMMARY

The primary object of the present invention is to provide a semiconductor structure comprising a carrier, a plurality of under bump metallurgy layers, a plurality of copper containing bumps, and at least one organic barrier layer, wherein mentioned carrier has a surface, a protective layer formed on said surface, and a plurality of conductive pads formed on said surface. The protective layer comprises a plurality of openings, and the conductive pads are exposed by the openings. The under bump metallurgy layers are formed on the conductive pads. The copper containing bumps are formed on the under bump metallurgy layers, each of the copper containing bumps comprises a top surface and a ring surface in connection with the top surface. The organic barrier layer has a first coverage portion, and mentioned first coverage portion covers the top surface and the ring surface of each of the copper containing bumps. Owning to the reason that mentioned organic barrier layer is included in the semiconductor structure, a short phenomenon occurred between two adjacent copper containing bumps via dissociation of copper ions can be prevented effectively.

DESCRIPTION OF THE DRAWINGS

FIGS. 4A to 4G are section diagrams illustrating a manufacturing procedure of the semiconductor structure in accordance with a first embodiment of the present invention.

DETAILED DESCRIPTION OF THE INVENTION

Figure 1:
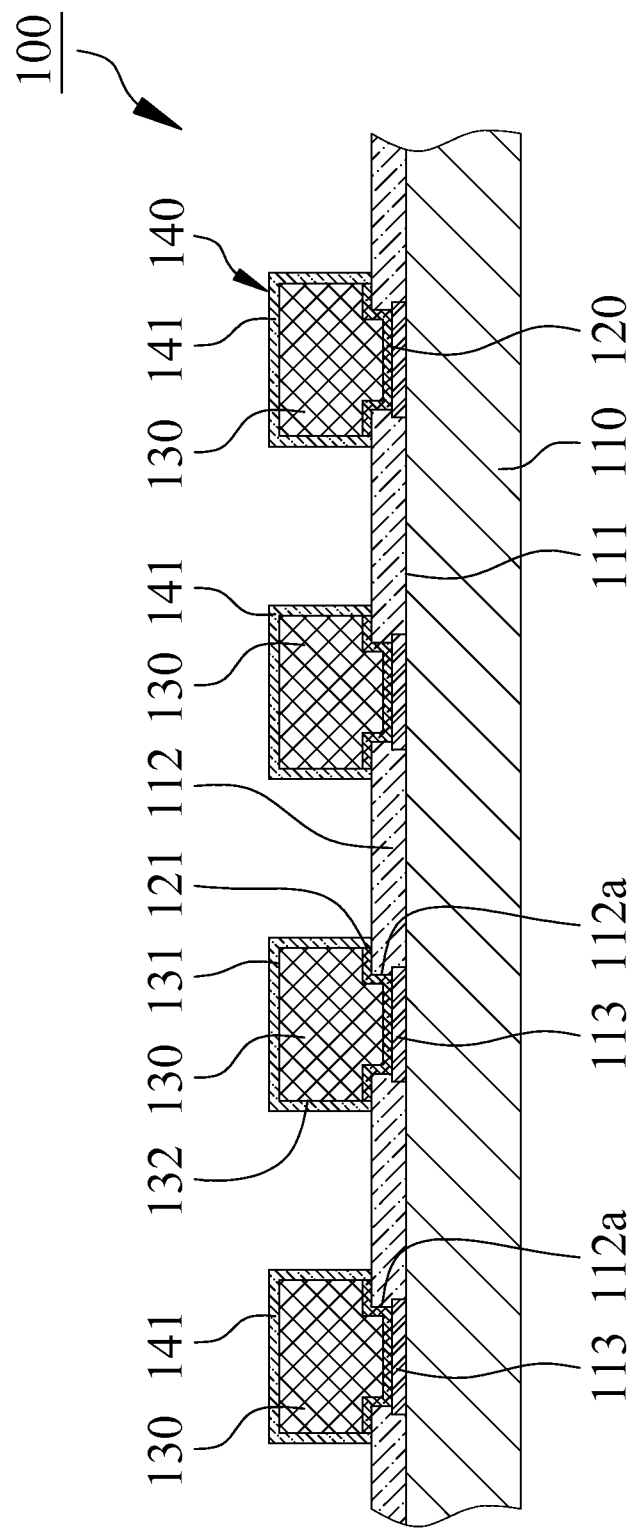
FIG. 1 is a section diagram illustrating a semiconductor structure in accordance with a first embodiment of the present invention.

With reference to FIG. 1, a semiconductor structure 100 in accordance with a first preferred embodiment of the present invention comprises a carrier 110, a plurality of under bump metallurgy layers 120, a plurality of copper containing bumps 130 and at least one organic barrier layer 140, wherein the carrier 110 comprises a surface 111, a protective layer 112 formed on the surface 111 and a plurality of conductive pads 113 formed on the surface 111. The protective layer 112 comprises a plurality of openings 112a, and the conductive pads 113 are exposed by the openings 112a. The carrier 110 can be chosen from one of silicon substrate, glass substrate, ceramic substrate, or copper clad laminate, in this embodiment, the carrier 110 can be a silicon substrate. The under bump metallurgy layers 120 are formed on the conductive pads 113. The copper containing bumps 130 are formed on the under bump metallurgy layers 120, each of the copper containing bumps 130 comprises a top surface 131 and a ring surface 132 in connection with the top surface 131. The organic barrier layer 140 has a first coverage portion 141, and mentioned first coverage portion 141 covers the top surface 131 and the ring surface 132 of each of the copper containing bumps 130. Preferably, each of the under bump metallurgy layer 120 comprises a ring wall 121, and the first coverage portion 141 covers the ring wall 121 of each of the under bump metallurgy layers 120. In this embodiment, the thickness of the organic barrier layer 140 is less than 10 um. The material of the organic barrier layer 140 can be chosen from organic polymer materials. The organic barrier layer 140 can be chosen from one of Brenzotriazole, Benzimidazole, Substituted Benzimidazole, or Aryl Phonylimidazole. Besides, the structure formula of Brenzotriazole (1), the structure formula of Benzimidazole (2), the structure formula of substituted Benzimidazole, and the structure formula of Aryl Phonylimidazole (4) are shown as below:

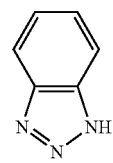
(1)

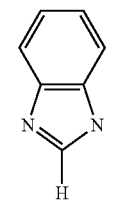
(2)

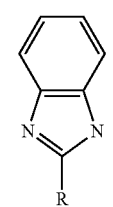
(3)

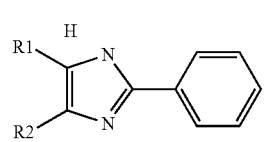
(4)

The organic barrier layer 140 is composed of Benzimidazole compound, formic acid, ammonia water, acetic acid, and water. The viscosity of the organic barrier layer 140 ranges from 1 to 1.2 cp. Owning to the reason that mentioned organic barrier layer 140 is included in the semiconductor structure 100, a short phenomenon occurred between adjacent copper containing bumps 130 via dissociation of copper ions can be effectively prevented.

Figure 2:
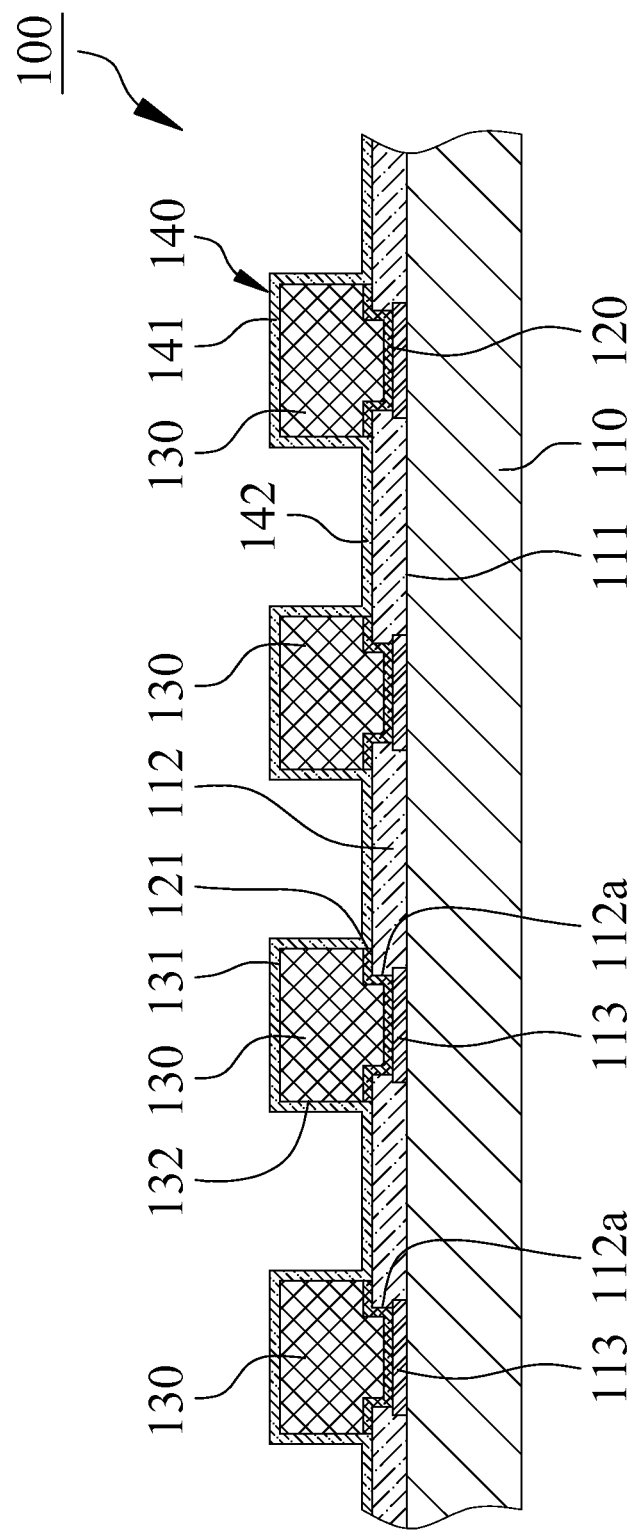
FIG. 2 is a section diagram illustrating another semiconductor structure in accordance with a second embodiment of the present invention.
Figure 3:
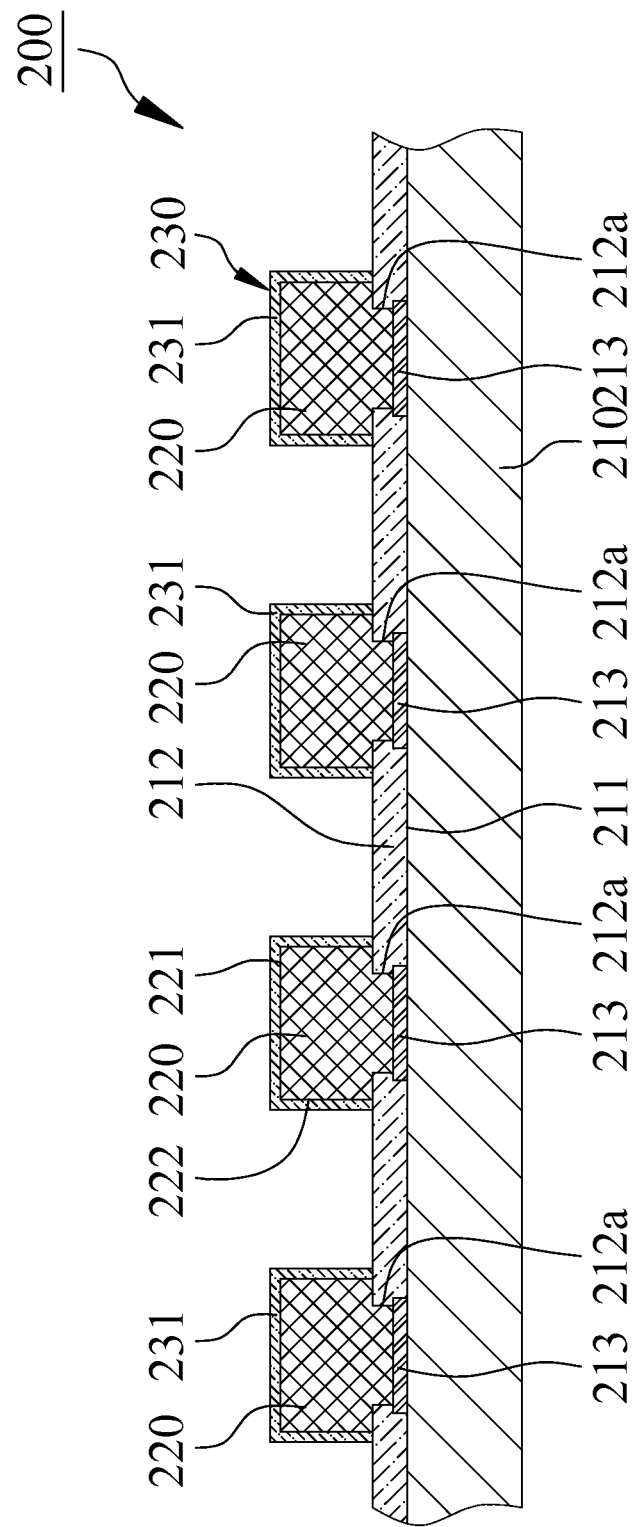
FIG. 3 is a section diagram illustrating another semiconductor structure in accordance with a preferred embodiment of the present invention.

Or, please referring to FIG. 2, which represents a second preferred embodiment of this invention, in this embodiment, the organic barrier layer 140 further comprises a second coverage portion 142, and the second coverage portion 142 covers the protective layer 112. With reference to FIG. 3, which represents a third preferred embodiment of this invention, a semiconductor structure 200 at least comprises a carrier 210, a plurality of copper containing bumps 220, and at least one organic barrier layer 230, wherein the carrier 210 comprises a surface 211, a protective layer 212 formed on the surface 211, and a plurality of conductive pads 213 formed on the surface 211. The protective layer 212 comprises a plurality of openings 212a, and the conductive pads 213 are exposed by the openings 212a. The carrier 210 can be chosen from one of silicon substrate, glass substrate, ceramic substrate, or copper clad laminate, in this embodiment, the carrier 210 can be a silicon substrate. The copper containing bumps 220 are formed on the conductive pads 213. Each of the copper containing bumps 220 comprises a top surface 221 and a ring surface 222 in connection with the top surface 221. The organic barrier layer 230 comprises a first coverage portion 231, and mentioned coverage portion 231 covers the top surface 221 and the ring surface 222 of each of the copper containing bumps 220. In this embodiment, the thickness of the organic barrier layer 230 is less than 10 um. The material of the organic barrier layer 230 can be chosen from organic polymer materials. The organic barrier layer 230 can be chosen from one of Brenzotriazole, Benzimidazole, Substituted Benzimidazole, or Aryl Phonylimidazole. The viscosity of the organic barrier layer 230 ranges from 1 to 1.2 cp.

Figure 4G:
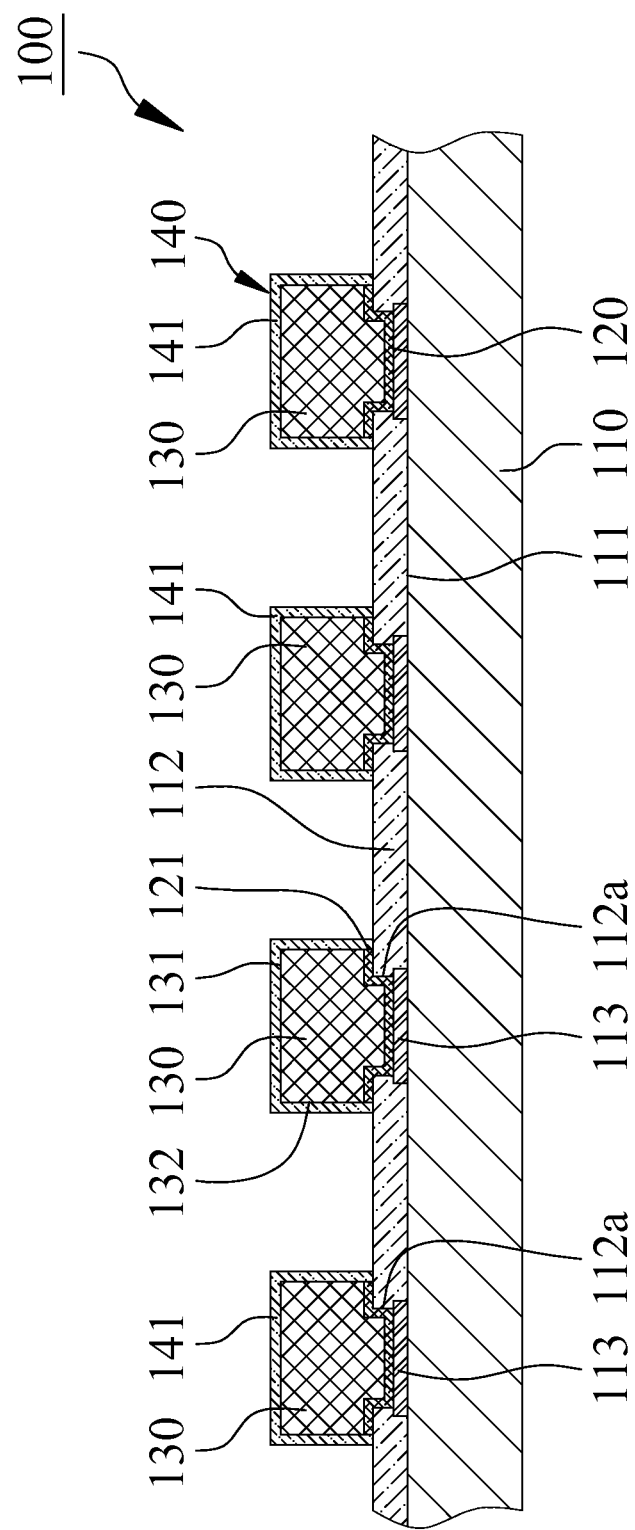

With reference to FIGS. 4A to 4G, which represent a manufacturing procedure of the semiconductor structure in accordance with the first preferred embodiment of this invention comprises the following steps, first, referring to FIG. 4A, providing a carrier 110 having a surface 111, a protective layer 112 formed on said surface 111, and a plurality of conductive pads 113 formed on said surface 111, wherein the protective layer 112 comprises a plurality of openings 112a, the conductive pads 113 are exposed by mentioned openings 112a, the carrier 110 can be chosen from on of silicon substrate, glass substrate, ceramic substrate, or copper clad laminate, in this embodiment, the carrier 110 can be a silicon substrate; next, referring to FIG. 4B, forming a plurality of under bump metallurgy layers 120 on the conductive pads 113, each of the under bump metallurgy layers 120 is extendedly formed at the protective layer 112 and comprises a ring wall 121; later, with reference to FIG. 4C, forming a photoresist layer P on the protective layer 112 and the under bump metallurgy layers 120; referring to FIG. 4D, patterning the photoresist layer P to form a plurality of bump openings P1 for exposing the under bump metallurgy layers 120; thereafter, referring to FIG. 4E, forming a copper-containing metal layer M on the under bump metallurgy layers 120 to make the copper-containing metal layer M form a plurality of copper containing bumps 130; with reference to FIG. 4F, removing the photoresist layer P to reveal the copper containing bumps 130, each of the copper containing bumps 130 comprises a top surface 131 and a ring surface 132 in connection with the top surface 131; eventually, referring to FIG. 4G, forming an organic barrier layer 140 on the copper containing bumps 130, wherein the organic barrier layer 140 comprises a first coverage portion 141, and mentioned first coverage portion 141 covers the top surface 131, the ring surface 132, and the ring wall 121 of each of the under bump metallurgy layers 120. In this embodiment, the thickness of the organic barrier layer 140 is less than 10 um. The material of the organic barrier layer 140 can be chosen from organic polymer materials. The organic barrier layer 140 can be chosen from one of Brenzotriazole, Benzimidazole, Substituted Benzimidazole, or Aryl Phonylimidazole. Besides, the structure formula of Brenzotriazole (1), the structure formula of Benzimidazole (2), the structure formula of substituted Benzimidazole, and the structure formula of Aryl Phonylimidazole (4) are shown as below:

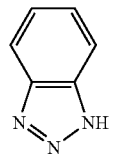

(1)

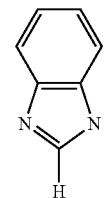

(2)

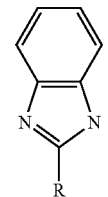

(3)

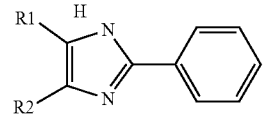

(4)

The organic barrier layer 140 is composed of Benzimidazole compound, formic acid, ammonia water, acetic acid, and water. The viscosity of the organic barrier layer 140 ranges from 1 to 1.2 cp.

Figure 5:
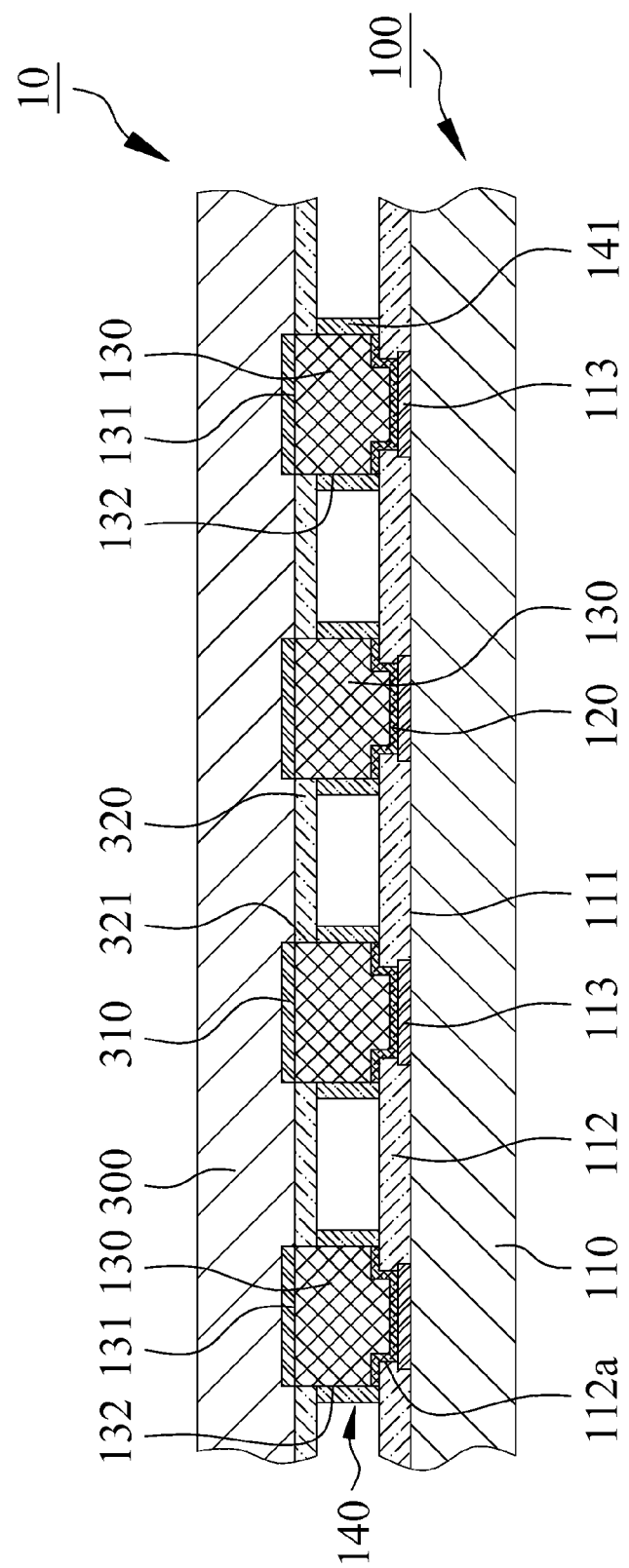
FIG. 5 is a semiconductor package structure in accordance with a first embodiment of the present invention.

Besides, referring to FIG. 5, which represents a semiconductor package structure 10 formed by the semiconductor structure 100 in accordance with first preferred embodiment of this invention at least comprises the semiconductor structure 100 and a substrate 300, wherein the semiconductor structure 100 includes a carrier 110, a plurality of under bump metallurgy layers 120, a plurality of copper containing bumps 130, and at least one organic barrier layer 140. The carrier 110 comprises a surface 111, a protective layer 112 formed on the surface 111 and a plurality of conductive pads 113 formed on the surface 111. The protective layer 112 comprises a plurality of openings 112a, and the conductive pads 113 are exposed by the openings 112a. The carrier 110 can be chosen from one of silicon substrate, glass substrate, ceramic substrate, or copper clad laminate, in this embodiment, the carrier 110 can be a silicon substrate. Each of the under bump metallurgy layers 120 is formed on the conductive pads 113 and comprises a ring wall 121. The copper containing bumps 130 are formed on the under bump metallurgy layers 120, each of the copper containing bumps 130 comprises a top surface 131 and a ring surface 132 in connection with the top surface 131.

The organic barrier layer 140 has a first coverage portion 141, and mentioned first coverage portion 141 covers the ring surface 132 of each of the copper containing bumps 130 and the ring wall 121 of each of the under bump metallurgy layers 120. The thickness of the organic barrier layer 140 is less than 10 um. The material of the organic barrier layer 140 can be chosen from organic polymer materials. The organic barrier layer 140 can be chosen from one of Brenzotriazole, Benzimidazole, Substituted Benzimidazole, or Aryl Phonylimidazole. In addition, the organic barrier layer 140 is composed of Benzimidazole compound, formic acid, ammonia water, acetic acid, and water. The viscosity of the organic barrier layer 140 ranges from 1 to 1.2 cp. The substrate 300 comprises a plurality of connective pads 310 and a solder mask layer 320 having a plurality of slots 321 for revealing the connective pads 310. The connective pads 310 are coupled with the copper containing bumps 130, and the first coverage portion 141 of the organic barrier layer 140 covers the solder mask layer 320.

While this invention has been particularly illustrated and described in detail with respect to the preferred embodiments thereof, it will be clearly understood by those skilled in the art that it is not limited to the specific features and describes and various modifications and changes in form and details may be made without departing from the spirit and scope of this invention.

What is claimed is:

1. The package structure at least comprising: a semiconductor structure comprising:
   a carrier having a surface, a protective layer formed on said surface, and a plurality of conductive pads formed on said surface, wherein the protective layer comprises a plurality of openings, and the conductive pads exposed by the openings;
   a plurality of under bump metallurgy layers formed on the conductive pads;
   a plurality of copper containing bumps formed on the under bump metallurgy layers, each of the copper containing bumps comprises a top surface and a ring surface in connection with the top surface; and
   at least one organic barrier layer having a first coverage portion, and the first coverage portion covers the ring surface of each of the copper containing bumps; and
   a substrate having a plurality of connective pads and a solder mask layer, wherein the solder mask layer comprises a plurality of slots for exposing the connective pads coupled with the copper containing layers, and the first coverage portion of the organic barrier layer covers the solder mask layer.

2. The package structure in accordance with claim 1, wherein the organic barrier layer further comprises a second coverage portion, the protective layer is covered with the second coverage portion.

3. The package structure in accordance with claim 1, wherein the thickness of the organic barrier layer is less than 10 um.

4. The package structure in accordance with claim 1, wherein the viscosity of the organic barrier layer ranges from 1 to 1.2 cp.

5. The package structure in accordance with claim 1, wherein the material of the organic barrier layer can be chosen from organic polymer materials.

6. The package structure in accordance with claim 5, wherein the organic barrier layer can be chosen from one of Brenzotriazole, Benzimidazole, Substituted Benzimidazole, or Aryl Phonylimidazole.

7. The package structure in accordance with claim 1, wherein the organic barrier layer is composed of Benzimidazole compound, formic acid, ammonia water, acetic acid, and water.

8. The package structure in accordance with claim 1, wherein the carrier can be chosen from one of silicon substrate, glass substrate, ceramic substrate, or copper clad laminate.

9. The package structure in accordance with claim 1, wherein each of the under bump metallurgy layers comprises a ring wall covered by the first coverage portion.

* * * * *